US012808938B2

(12) United States Patent
Yoshida et al.

(10) Patent No.: US 12,808,938 B2
(45) Date of Patent: Nov. 24, 2026

(54) BATTERY SYSTEM FOR CALCULATION OF STATE OF CHARGE OF BATTERY

(71) Applicant: TOYOTA JIDOSHA KABUSHIKI KAISHA, Toyota (JP)

(72) Inventors: Hiroshi Yoshida, Anjo (JP); Takashi Ogura, Seto (JP); Yuki Sugo, Seto (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 135 days.

(21) Appl. No.: 18/777,793

(22) Filed: Jul. 19, 2024

(65) Prior Publication Data

US 2025/0138099 A1 May 1, 2025

(30) Foreign Application Priority Data

Oct. 11, 2023 (JP) ................................. 2023-175738

(51) Int. Cl.
*G01R 31/3835* (2019.01)
*B60L 58/12* (2019.01)

(52) U.S. Cl.
CPC .......... *G01R 31/3835* (2019.01); *B60L 58/12* (2019.02)

(58) Field of Classification Search
None
See application file for complete search history.

(56) References Cited

U.S. PATENT DOCUMENTS

| | | | | | |
|---|---|---|---|---|---|
| 6,366,054 | B1 * | 4/2002 | Hoenig | G01R 31/388 | 320/132 |
| 8,887,872 | B2 * | 11/2014 | Chen | B66B 1/308 | 187/290 |
| 10,627,452 | B2 * | 4/2020 | Kim | G01R 31/396 | |
| 11,567,137 | B2 * | 1/2023 | Kim | H01M 10/48 | |
| 2013/0020997 | A1 * | 1/2013 | Iwasawa | H01M 10/441 | 320/116 |
| 2019/0025377 | A1 | 1/2019 | Sejima | | |
| 2025/0140944 | A1 * | 5/2025 | Yoshida | B60L 58/16 | |

FOREIGN PATENT DOCUMENTS

| | | | |
|---|---|---|---|
| JP | 2017-125813 | A | 7/2017 |
| JP | 2018-063115 | A | 4/2018 |
| JP | 2023-116925 | A | 8/2023 |

* cited by examiner

*Primary Examiner* — Richard Isla
(74) *Attorney, Agent, or Firm* — SoraIP, Inc.

(57) ABSTRACT

The battery system includes a battery and a control device for estimating an SOC of the battery. SOC-OCV properties of the cell have a voltage-flat area. When the control device is activated for the first time, the control device estimates SOC of the cell based on SOC-OCV properties. At this time, when the voltage of the battery is in the voltage flat region (Va≤VB≤Vb), S1 that is the intermediate value of the voltage flat region a is estimated to be SOC of the battery.

6 Claims, 4 Drawing Sheets

BATTERY SYSTEM FOR CALCULATION OF STATE OF CHARGE OF BATTERY

CROSS-REFERENCE TO RELATED APPLICATION

This application claims priority to Japanese Patent Application No. 2023-175738 filed on Oct. 11, 2023, incorporated herein by reference in its entirety.

BACKGROUND

1. Technical Field

The present disclosure relates to a battery system.

2. Description of Related Art

Japanese Unexamined Patenttent Application Publication No. 2018-63115 (JP 2018-63115 A) discloses a technique of appropriately estimating a state of charge (SOC) of a secondary battery with a wide plateau area. The plateau area is an area in which an open circuit voltage (OCV) of a secondary battery hardly varies even when the SOC varies, and is also referred to as a "flat voltage area" in the present disclosure. In JP 2018-63115 A, the internal resistance of the secondary battery is calculated from the current and the voltage at the time of charging and discharging, and the SOC is estimated using the relationship between the internal resistance and the SOC.

SUMMARY

In general, the SOC of a secondary battery is calculated by a control device that includes an input device, a central processing unit (CPU), a memory, etc. In a battery system constituted from a battery (secondary battery), a control device, etc., it is desired to estimate the SOC of the battery at the same time as the control device is first started, such as when the battery system is shipped or when the control device is replaced. While the SOC is estimated by calculating the internal resistance of the battery from the current and the voltage at the time of charging and discharging in JP 2018-63115 A, the internal resistance cannot be calculated from the current and the voltage at the time of charging and discharging when the control device is first started. For this reason, it is conceivable to estimate the SOC based on the SOC-OCV property when the control device is first started.

In a battery with an SOC-OCV property having a flat voltage area, however, the estimated SOC greatly fluctuates due to detection errors and the like if the detected voltage of the battery is in the flat voltage area, and thus the estimation error of the SOC may increase and the estimation accuracy of the SOC may deteriorate.

An object of the present disclosure is to suppress deterioration in the estimation accuracy of an SOC when a control device is first started.

An aspect of the present disclosure provides a battery system including: a battery; a voltage sensor that detects a voltage of the battery; and a control device that estimates a state of charge (SOC) of the battery. An SOC-open circuit voltage (OCV) property of the battery has a flat voltage area in which variations in the OCV with respect to the SOC are small. The control device is configured to, when the control device is first started, estimate the SOC based on the SOC-OCV property, and estimate a predetermined value set in advance as the SOC when the voltage detected by the voltage sensor is in the flat voltage area. The predetermined value is set to a value within a range of the SOC in the flat voltage area.

According to this configuration, the SOC is estimated based on the SOC-OCV property when the control device is first started. A predetermined value set in advance is estimated as the SOC when the voltage detected by the voltage sensor is in the flat voltage area of the SOC-OCV property.

When the detected voltage fluctuates due to a detection error of the voltage sensor or the like, the SOC estimated based on the SOC-OCV property greatly fluctuates in the flat voltage area. When the voltage detected by the voltage sensor is in the flat voltage area, a predetermined value set in advance is estimated as the SOC. If the predetermined value is set to a value within the range of the SOC in the flat voltage area, it is possible to suppress an increase in the estimation error of the SOC, and to suppress deterioration in the estimation accuracy of the SOC, even if the detected voltage fluctuates.

Preferably, the predetermined value is an intermediate value of the SOC in the flat voltage area. If the predetermined value is set to an intermediate value of the SOC in the flat voltage area, the estimation error of the SOC can be reduced.

Preferably, the battery is an assembled battery in which a plurality of unit cells is connected in series; and the voltage sensor detects a voltage of each of the unit cells. The control device may be configured to estimate an SOC of each of the unit cells based on a detected value from the voltage sensor, determine a representative SOC from estimated SOCs of the unit cells, and adopt the representative SOC as the SOC of the battery.

According to this configuration, it is possible to reduce the estimation error of the SOC of the assembled battery, and to suppress deterioration in the estimation accuracy of the SOC.

Preferably, the control device may be configured to: determine whether the voltage of each of the unit cells is in the flat voltage area or in an area other than the flat voltage area in the SOC-OCV property; and determine the representative SOC based on voltages of unit cells in an area in which a largest number of voltages of the unit cells are present.

According to this configuration, it is determined whether the voltage of each of the unit cells is in the flat voltage area or in an area other than the flat voltage area in the SOC-OCV property. Then, the representative SOC is determined based on voltages of unit cells in an area in which a largest number of voltages of the unit cells are present, and thus it is possible to suppress deterioration in the estimation accuracy of the SOC of the assembled battery, even if the SOC of each of the unit cells fluctuates.

The battery system may be mounted on a vehicle; and the control device may include a non-volatile memory.

According to this configuration, it is possible to estimate the SOC of the battery and store the estimated SOC in the non-volatile memory when the control device is first started, such as when the vehicle is shipped or when the control device is replaced.

According to the present disclosure, it is possible to suppress deterioration in the estimation accuracy of an SOC when a control device is first started.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
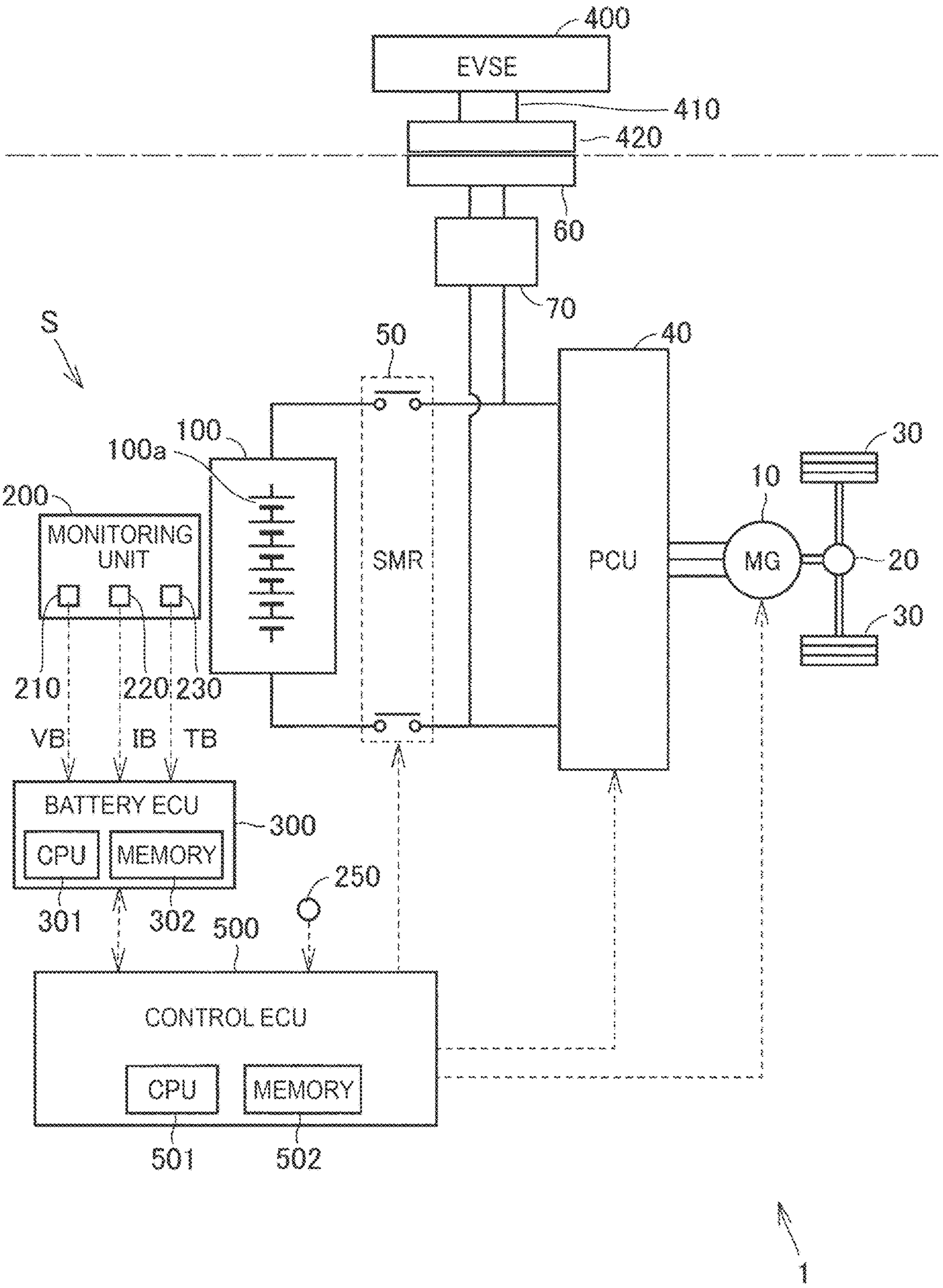
FIG. 1 is an entire configuration diagram of an electrified vehicle in which a battery system according to the present embodiment is mounted.

Hereinafter, an embodiment of the present disclosure will be described in detail with reference to the drawings. In the drawings, the same or corresponding parts are denoted by the same reference numerals, and the description thereof will not be repeated.

FIG. 1 is an entire configuration diagram of an electrified vehicle 1 in which a battery system S according to the present embodiment is mounted. In the present embodiment, electrified vehicle 1 is, for example, a battery electric vehicle. Electrified vehicle 1 includes a Motor Generator (MG) 10 which is a rotary electric machine, power transmission gears 20, drive wheels 30, a Power Control Unit (PCU) 40, a System Main Relay (SMR) 50, a battery 100, a monitoring unit 200, a battery Electronic Control Unit (ECU) 300 which is an exemplary control device, and a control ECU 500.

MG 10 is, for example, an embedded-structure permanent-magnet synchronous motor (IPM motor), and has a function as an electric motor and a function as a generator. The output-torque of MG 10 is transmitted to the drive wheels 30 via the power transmission gears 20 including a speed reducer, a differential, and the like.

When electrified vehicle 1 is braked, MG 10 is driven by the drive wheels 30, and MG 10 operates as a generator. As a result, MG 10 also functions as a braking device that performs regenerative braking for converting kinetic energy of electrified vehicle 1 into electric power. The regenerative electric power generated by the regenerative braking force in MG 10 is stored in the battery 100.

PCU 40 is a power converter that bi-directionally converts power between MG 10 and the battery 100. PCU 40 includes, for example, inverters and converters that operate based on control signals from the control ECU 500.

When the battery 100 is discharged, the converter steps up voltage supplied from the battery 100 and supplies the stepped-up voltage to the inverter. The inverter converts DC power supplied from the converter into AC power to drive MG 10.

On the other hand, when the battery 100 is charged, the inverter converts AC power generated by MG 10 into DC power and supplies the DC power to the converter. The converter steps down voltage supplied from the inverter to voltage suitable for charging the battery 100 and supplies the stepped-down voltage to the battery 100.

SMR 50 is electrically connected to a power line connecting the battery 100 and PCU 40. If SMR 50 is ON (i.e., conductive) in response to a control signal from the control ECU 500, power may be transferred between the battery 100 and PCU 40. On the other hand, if SMR 50 is OFF (i.e., disconnected) in response to a control signal from the control ECU 500, the battery 100 is disconnected from PCU 40.

The battery 100 stores electric power for driving MG 10. The battery 100 is a rechargeable DC power source (secondary battery), and is an assembled battery in which a plurality of unit cells (battery cells) 100*a* are electrically connected in series. The battery 100 and the unit cell 100*a* correspond to the "cell" of the present disclosure. The unit cell 100*a* may comprise, for example, a lithium-ion cell. In the present embodiment, an iron 20 phosphate lithium-ion battery (LFP battery) using phosphorus (P), iron (Fc), and lithium (Li) as the positive electrode material is employed as the unit cell 100*a*.

The monitoring unit 200 includes a voltage sensor 210, a current sensor 220, and a temperature sensor 230. The voltage sensor 210 detects a voltage VB (a voltage VB between terminals of the unit cell 100*a*) of the unit cell 100*a*. The current sensor 220 detects a current IB input to and output from the battery 100 (unit cell 100*a*). The temperature sensor 230 detects a temperature TB of each of the unit cell 100*a*. The sensor outputs the detected signal to the battery ECU 300.

Electrified vehicle 1 includes an inlet 60, and the battery 100 can be externally charged using an Electric Vehicle Supply Equipment (EVSE) 400. The inlet 60 is configured to be connectable to a connector 420 provided at a distal end of EVSE400 charge cable 410. The inlet 60 is electrically connected to a power line connected to the battery 100 via the charging circuit 70. In the present embodiment, when SMR 50 is closed, the inlet 60 and the battery 100 are connected to each other to enable external charging. Note that an inlet 60 (charging circuitry 70) may be connected to a power line between the battery 100 and SMR 50 via a charging relay, and the charging relay may be closed, so that the battery 100 can be externally charged.

The battery ECU 300 includes a CPU 301 and memories 302. Memory 302 includes non-volatile memory (e.g., flash memory). The battery ECU 300 estimates SOC of the battery 100 using the signal received from the monitoring unit 200, and outputs the estimated signal to the control ECU 500. The battery system S includes a battery 100 (unit cell 100*a*), a monitoring unit 200, a battery ECU 300, and the like.

The control ECU 500 includes a CPU 501 and a memory 502. Memory 502 includes non-volatile memory (e.g., flash memory). The control ECU 500 controls the devices so that electrified vehicle 1 is in a desired condition based on signals received from the battery ECU 300, signals from various sensors (not shown) (e.g., accelerator operation amount signal, vehicle speed signal, and the like), maps and programs stored in the memory 502, and the like.

Figure 2:
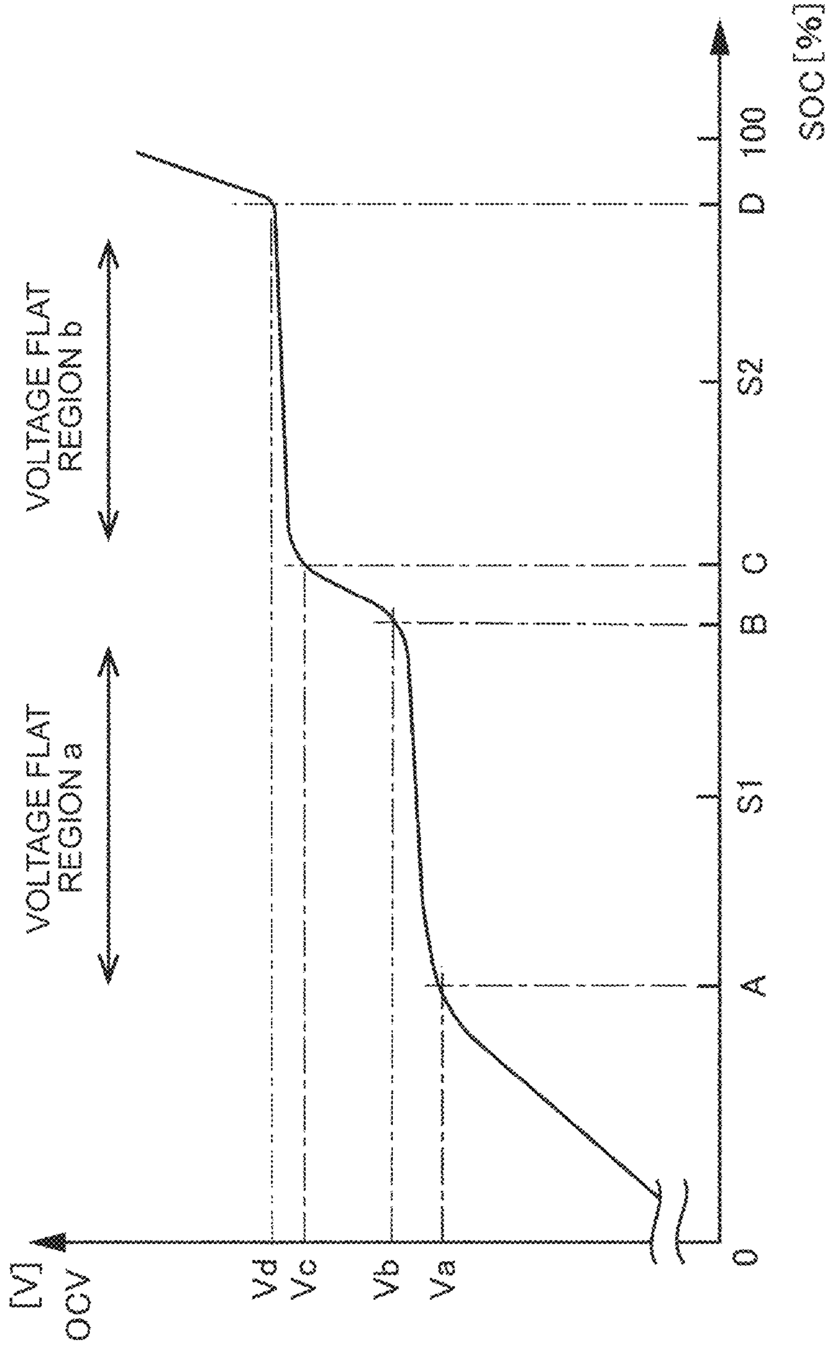
FIG. 2 is a diagram for explaining SOC-OCV properties of the unit cell (LFP battery) of the present embodiment.

FIG. 2 is a diagram for explaining SOC-OCV properties of the unit cell (LFP battery) 100*a* of the present embodiment. In FIG. 2, the vertical axis represents OCV [V] of the unit cell 100*a*, and the horizontal axis represents the SOC [%] of the unit cell 100*a*. As illustrated in FIG. 2, in the relationship between SOC and OCV (hereinafter, this relationship is also referred to as a OCV curve), a change in OCV is slight with respect to a change in SOC, and a region (voltage-flat region) in which a change in the OCV curve is minute is broadly present. Therefore, when SOC of the battery 100 (unit cell 100*a*) is estimated using the voltage VB detected by the voltage sensor 210 based on SOC-OCV property, the estimation error of SOC in the voltage flat area becomes large due to the variation caused by the detection error of the voltage VB or the like.

In order to reduce the estimation error of SOC, for example, when the battery 100 is fully charged and finished when the battery 100 is externally charged, SOC is set to 100 [%]. Thereafter, SOC is estimated by the current integration method using the integrated value of the input/output current IB. By estimating SOC in this way, the estimation error of SOC in the voltage-flat area can be reduced. When IG switch (power switch) 250 is turned off, the current SOC is stored in the non-volatile memory of the battery ECU 300. Accordingly, when IG switch 250 is turned on next time, SOC can be read from the nonvolatile memory to acquire SOC.

When the battery ECU 300 is started for the first time when electrified vehicle 1 is shipped or the battery ECU 300 is replaced, SOC of the battery 100 is not stored in the nonvolatile memory. For this reason, it is conceivable to estimate SOC based on SOC-OCV property by using the voltage VB at the time of initial startup of the battery ECU 300. However, in the voltage flat area of SOC-OCV property, the estimation error of SOC increases due to the variation in the voltage VB due to the accuracy of detecting the voltage sensor 210 or the like.

Referring to FIG. 2, in the voltage-flat area a where SOC is A to B [%], OCV when SOC=A is Va [V], and OCV when SOC=B is Vb [V] (e.g., A=29 [%], B=61 [%], Va=3.28 [V], Vb=3.31 [V]). When SOC-OCV property shown in FIG. 2 is used to estimate SOC, in the voltage flat region a, the estimated SOC varies from A to B when the voltage VB varies from Va to Vb (for example, when the magnitude of the variation in the voltage VB is 0.03 [V], SOC varies from 29 to 60 [%]). Therefore, when SOC is estimated based on SOC-OCV property, the estimation error of SOC increases in the voltage-flat area a, and the estimation accuracy of SOC deteriorates. In the present embodiment, when SOC is estimated based on SOC-OCV property at the time of the first startup of the battery ECU 300, the intermediate value of SOC in the voltage flat region is set as the estimated value of SOC when the voltage VB is in the voltage flat region. Accordingly, the estimation error of SOC is reduced, and deterioration of the estimation accuracy of SOC is suppressed.

Figure 3:
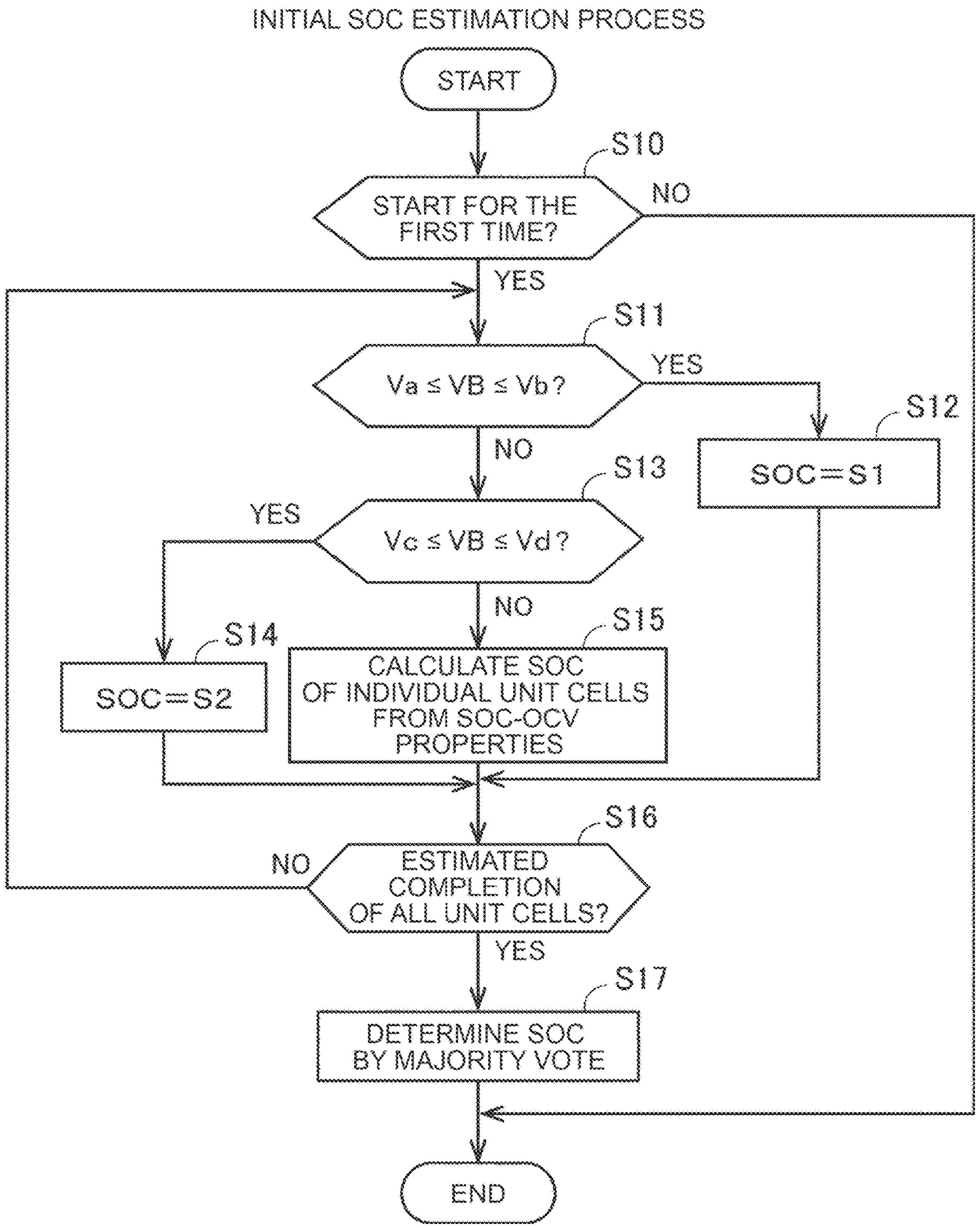
FIG. 3 is a flow chart illustrating an exemplary initial SOC estimation process performed by the battery ECU in the present embodiment.

FIG. 3 is a flow chart illustrating an exemplary initial SOC estimation process performed by the battery ECU 300 in the present embodiment. This flow chart is executed when IG switch 250 is operated from off to on. In step (hereinafter, step is abbreviated as "S") 10, it is determined whether or not the battery ECU 300 is started for the first time. For example, when SOC read from the nonvolatile memory is zero when SOC stored in the nonvolatile memory included in the memory 302 is set to zero when the battery ECU 300 is shipped, it may be determined that the battery ECU 300 is started for the first time (initial startup). When the accumulated travel distance of electrified vehicle 1 is stored in the nonvolatile memory of the memory 302, the accumulated travel distance stored in the nonvolatile memory of the control ECU 500 may be compared with the accumulated travel distance read from the nonvolatile memory of the memory 302, and when the accumulated travel distances differ, it may be determined that the battery ECU 300 is started for the first time. In S10, when it is determined that the battery ECU 300 is started for the first time, the process proceeds to S11, and when it is not started for the first time, the process ends.

In S11, it is determined whether or not the voltage VB detected by the voltage sensor 210 is in the voltage flat area a. If "Va≤VB≤Vb" is satisfied and the voltage VB is in the voltage flat area a, an affirmative determination is made and the process proceeds to S12. If "VB<Va" or "VB>Vb" and the voltage VB does not exist in the voltage flat area a, a negative determination is made and the process proceeds to S13.

In S12, SOC of the unit cell **100*a* in which the voltage VB is detected is calculated as S1 [%], and then the process proceeds to S16. S1 is an intermediate value of SOC in the voltage-flat area a, and in the case of FIG. 2**, "S1=(A+B)/2".

In S13, it is determined whether or not the voltage VB detected this time is in the voltage flat area b. If "Vc≤VB≤Vd" is satisfied and the voltage VB is in the voltage flat area b, an affirmative determination is made and the process proceeds to S14. If "VB<Vc" or "VB>Vd" and the voltage VB does not exist in the voltage flat area b, a negative determination is made and the process proceeds to S15.

In S14, SOC of the present unit cell **100*a* is calculated as S2 [%], and then the process proceeds to S16. S2 is an intermediate value of SOC in the voltage-flat area b, and is "S2=(C+D)/2" in the case of FIG. 2**.

In S15, SOC of the unit cell **100*a* is calculated from SOC-OCV property in FIG. 2 using the voltage VB, and then the process proceeds to S16. SOC is calculated by fitting the voltage VB to the value of OCV of FIG. 2, and SOC is calculated as a value ranging from B to C. Note that SOC calculated by S15** is calculated with a range of 1 [%], and the decimal point is rounded off or rounded off.

In S16, it is determined whether or not SOC has been calculated for all the unit cell **100*a* included in the battery 100. If the SOCs of all the unit cells 100*a* have not been calculated, the SOC of the subsequent unit cell 100*a* is calculated by returning to S11. When the SOCs of all the unit cell 100*a* have been calculated, an affirmative determination is made by S16, and the process proceeds to S17**.

In S17, SOC of the battery 100 is estimated by a majority vote. From the SOCs of all the unit cell **100*a* calculated in S12, S14, and S15, the most abundant SOC is extracted as a representative SOC. Then, the representative SOC is adopted as the SOC of each unit cell 100*a* and the battery 100**, and the present routine is ended. After the estimation of SOC is completed by the initial SOC estimation process, the estimation of SOC by the current integration method using the integrated value of the input/output current IB is started (SOC is updated as needed by the current integration method).

According to the present embodiment, when the battery ECU 300 is activated for the first time, SOC is estimated based on SOC-OCV property. When the voltage VB detected by the voltage sensor 210 is in the voltage flat region a of SOC-OCV property, S1 is estimated as SOC, and when it is in the voltage flat region b, S2 is estimated as SOC.

When the voltage varies in VB due to a detected error or the like of the voltage VB, SOC estimated based on SOC-OCV property varies greatly in the voltage flat regions a and b, and the estimation error of SOC increases. However, it is possible to suppress an increase in the estimation error of SOC because S1, S2, which is the intermediate value of SOC in the voltage-flat regions a and b, is estimated as a SOC, and thus it is possible to suppress the deterioration of SOC estimation accuracy.

According to the present embodiment, each SOC of the unit cell **100*a* is estimated, a representative SOC is determined from the estimated SOCs of the unit cells 100*a*, and the representative SOC is adopted as the SOC of the unit cell 100*a* and the battery 100**. Even if the voltage VB variation increases estimation error of the SOC of any of the unit cells

100*a*, an SOC having a smaller estimation error can be adopted as the SOC of the unit cell 100*a* and the battery 100.

In the above embodiment, the flow chart of FIG. 3 is executed when IG switch 250 is operated from off to on. When electrified vehicle 1 is shipped, when the battery ECU 300 is started for the first time, S10 may be omitted and the process may be started from S11. Here, for example, when the battery ECU 300 is connected to the power supply (+B), the process may be started from S11. Further, in the control ECU 500, the process may be started from S11 when it is detected that IG switch 250 is operated from off to on for the first time.

In the above-described embodiment, S1 is set to "S1=(A+B)/2", which is an intermediate value of SOC in the voltage-flat area a. However, S1 may not be an intermediate value, and may be a value that falls within the range of the voltage-flat area a. For example, S1 may be set between "(A+B)×0.2" and "(A+B)×0.8". Similarly, in the voltage-flat area b, S2 may be set to a value between "(C+D)×0.2" and "(C+D)×0.8".

Modifications

Figure 4:
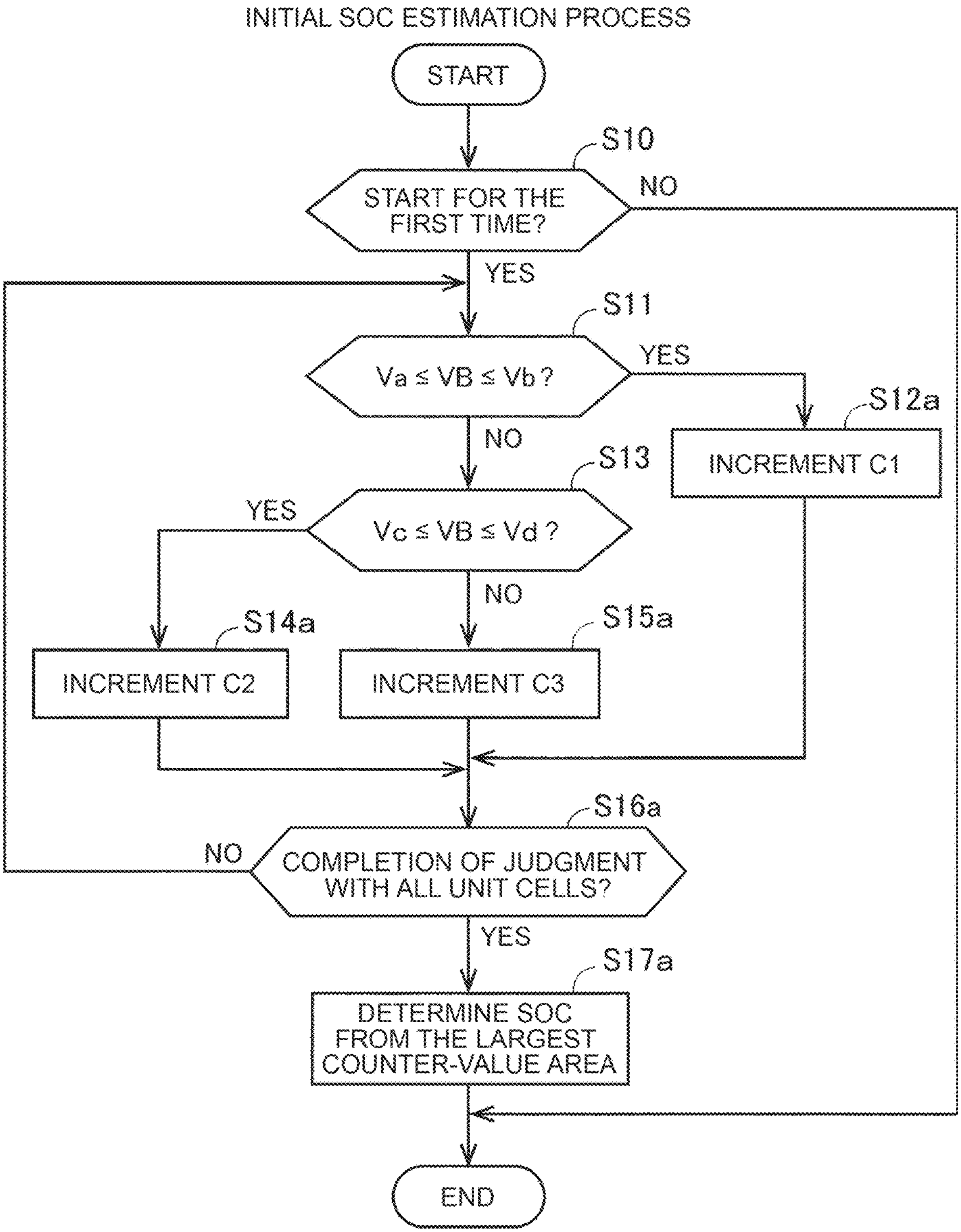
FIG. 4 is a flow chart illustrating an example of an initial SOC estimation process performed in the battery ECU in a modified example.

FIG. 4 is a flow chart illustrating an example of an initial SOC estimation process performed in the battery ECU 300 in a modified example. This flow chart is also executed when IG switch 250 is operated from off to on. In this modification, in the flow chart shown in FIG. 3, S12 is changed to S12*a*, S14 to S14*a*, S15 to S15*a*, S16 to S16*a*, and S17 to S17*a*. The other steps are the same as those in the process of FIG. 3, and thus the description thereof will be omitted.

In S12*a*, the counter C1 is incremented. In S14*a*, the counter C2 is incremented. In S15*a*, the counter C3 is incremented. The default value of the counters C1, C2, C3 is zero.

In S16*a*, it is determined whether or not an area in which the voltage VB is present is determined in all the unit cell 100*a* included in the battery 100. In all the unit cell 100*a*, if the region of the voltage VB has not been determined, the process returns to S11 to determine the region of the voltage VB of the subsequent unit cell 100*a*. When the regions of the voltage VB of all the unit cell 100*a* are determined, an affirmative determination is made by S16*a*, and the process proceeds to S17*a*.

In S17*a*, SOC of the battery 100 is estimated by a majority vote. When the counter C1 is larger than the counter C2 and the counter C3, a S1 (=(A+B)/2) is set as a representative SOC. When the counter C2 is larger than the counter C1 and the counter C3, a S2 (=(C+D)/2) is set as a representative SOC.

When the value of the counter C3 is larger than the counter C1 and the counter C2, the mean value of SOC calculated based on SOC-OCV property is set as the representative SOC using the voltage VB of the individual unit cell 100*a* counted by S15*a*. Then, the representative SOC is adopted as SOC of each unit cell 100*a* and the battery 100, and the present routine is ended. After the estimation of SOC is completed by the initial SOC estimation process, the estimation of SOC by the current integration method using the integrated value of the input/output current IB is started (SOC is updated as needed by the current integration method).

Also in this variant, when the battery ECU 300 is activated for the first time, SOC is estimated based on SOC-OCV properties shown in FIG. 2. The voltage VB detected by the voltage sensor 210 is determined to be in any of the voltage flat region a, the voltage flat region b, or a region other than the voltage flat region, and the representative SOC is determined based on the voltage VB of the region where the voltage VB is most abundant. If it is in the voltage flat region a of SOC-OCV property, S1 is set as a representative SOC, and if it is in the voltage flat region b, S2 is set as a representative SOC. A representative SOC is adopted as SOC of each unit cell 100*a* and the battery 100.

When the voltage varies in VB due to a detected error or the like of the voltage VB, SOC estimated based on SOC-OCV property varies greatly in the voltage flat regions a and b, and the estimation error of SOC increases. However, it is possible to suppress an increase in the estimation error of SOC because S1, S2, which is the intermediate value of SOC in the voltage-flat regions a and b, is estimated as a SOC, and thus it is possible to suppress the deterioration of SOC estimation accuracy.

In the above-described embodiment, an iron phosphate lithium-ion battery (LFP battery) is employed as the unit cell 100*a*. However, the unit cell 100*a* may be another type of cell as long as the cell has a small region (voltage-flat region) in which OCV curve changes.

The vehicle to which the battery system S is applicable is not limited to electrified vehicle 1 of FIG. 1. For example, the present disclosure is also applicable to a plug-in hybrid electric vehicle including an engine and a motor generator, and is also applicable to a fuel cell electric vehicle including a storage battery and capable of being externally charged. Alternatively, the vehicle may be an industrial vehicle such as a forklift. The battery system S may be a stationary battery.

When IG switch 250 is turned off, if a configuration is adopted in which SOC at that time is stored in the nonvolatile memory of the memory 302 and the nonvolatile memory of the memory 502, SOC at the time of initial startup of the battery ECU 300 may be estimated using SOC stored in the nonvolatile memory of the memory 502 when the battery ECU 300 is replaced. For example, when an affirmative determination is made in S10 of FIG. 3 or FIG. 4, it is determined whether or not SOC is stored in the nonvolatile memory (memory 502) of the control ECU 500, and when SOC is stored, SOC may be determined as a representative SOC, SOC may be estimated, and the routine may be ended. When SOC is not stored in the nonvolatile memories of the control ECU 500, S11 and subsequent processes are performed.

The embodiment disclosed herein shall be construed as exemplary and not restrictive in all respects. The scope of the present disclosure is defined not by the above description of the embodiments but by the claims, and is intended to include all possible modifications within a scope equivalent in meaning and scope to the claims.

What is claimed is:

1. A battery system comprising:
- a battery;
- a voltage sensor that detects a voltage of the battery; and
- a control device that calculates a state of charge (SOC) of the battery, wherein:
- an SOC-open circuit voltage (OCV) property of the battery has a flat voltage area in which variations in the OCV with respect to the SOC are small;
- the voltage sensor is configured to output the detected voltage to the control device; and
- the control device is configured to,
  - determine whether the control device is started for a first time, in response to the control device being started, determine whether the detected voltage is in the flat voltage area, in response to the determination being made that the control device is started for the first time, estimate that the SOC is equal to a predetermined value, in a case where the determination is made that the detected voltage is in the flat voltage area, the predetermined value being set before the control device is started for the first time, and being a value within a range of the SOC in the flat voltage area, and calculate the SOC based on the SOC-OCV property, in a case where the determination is made that the detected voltage is not in the flat voltage area.

2. The battery system according to claim 1, wherein the predetermined value is an intermediate value of the SOC in the flat voltage area.

3. The battery system according to claim 1, wherein:

the battery is an assembled battery in which a plurality of unit cells is connected in series;

the voltage sensor detects a voltage of each of the unit cells; and the control device is configured to calculate an SOC of each of the unit cells based on a detected value from the voltage sensor, determine a representative SOC from calculated SOCs of the unit cells, and adopt the representative SOC as the SOC of the battery.

4. The battery system according to claim 3, wherein the control device is configured to:

determine whether the voltage of each of the unit cells is in the flat voltage area or in an area other than the flat voltage area in the SOC-OCV property; and determine the representative SOC based on voltages of unit cells in an area in which a largest number of voltages of the unit cells are present.

5. The battery system according to claim 3, wherein:

the battery system is mounted on a vehicle; and the control device includes a non-volatile memory.

6. The battery system according to claim 1, wherein:

the control device includes a non-volatile memory configured to store a value of the SOC of the battery; and the control device is configured to determine that the control device is started for the first time, in a case where the value of the SOC of the battery acquired from the non-volatile memory is equal to a predetermined initial value of the SOC of the battery.

* * * * *